(12) United States Patent
Choi et al.

(10) Patent No.: US 9,234,270 B2
(45) Date of Patent: Jan. 12, 2016

(54) ELECTROSTATIC CHUCK, THIN FILM DEPOSITION APPARATUS INCLUDING THE ELECTROSTATIC CHUCK, AND METHOD OF MANUFACTURING ORGANIC LIGHT EMITTING DISPLAY APPARATUS BY USING THE THIN FILM DEPOSITION APPARATUS

(75) Inventors: Young-Mook Choi, Yongin (KR);
Jong-Heon Kim, Yongin (KR);
Mu-Hyun Kim, Yongin (KR); Beohm Rock Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 790 days.

(21) Appl. No.: 13/466,886

(22) Filed: May 8, 2012

(65) Prior Publication Data

US 2012/0288619 A1 Nov. 15, 2012

(30) Foreign Application Priority Data

May 11, 2011 (KR) .................. 10-2011-0044078

(51) Int. Cl.
*B05D 5/12* (2006.01)
*C23C 14/24* (2006.01)
*H01J 9/22* (2006.01)
(Continued)

(52) U.S. Cl.
CPC ............... *C23C 14/24* (2013.01); *C23C 14/243* (2013.01); *C23C 14/50* (2013.01); *H01J 9/221* (2013.01); *H01L 21/67173* (2013.01); *H01L 21/6831* (2013.01)

(58) Field of Classification Search
None
See application file for complete search history.

(56) References Cited

U.S. PATENT DOCUMENTS 4,468,648 A 8/1984 Uchikune
5,487,609 A 1/1996 Asada
(Continued)

FOREIGN PATENT DOCUMENTS

EP 1 413 644 A2 4/2004
EP 1 418 250 A2 5/2004
(Continued)

OTHER PUBLICATIONS

KIPO Registration Determination Certificate dated Jul. 2, 2012, for Korean Patent application 10-2010-0011480, (5 pages).
(Continued)

*Primary Examiner* — Shamim Ahmed
*Assistant Examiner* — Bradford Gates
(74) *Attorney, Agent, or Firm* — Christie, Parker & Hale, LLP

(57) ABSTRACT

An electrostatic chuck, a thin film deposition apparatus including the electrostatic chuck, and a method of manufacturing an organic light emitting display apparatus using the thin film deposition apparatus. The electrostatic chuck includes: a first plate; a first common wire disposed on the first plate and electrically connected to a plus terminal of an electric power source; first electrode patterns electrically connected to the first common wire, separated by a distance from each other, and extending from the first common wire; a second common wire disposed on the first plate and electrically connected to a minus terminal of the electric power source; second electrode patterns electrically connected to the second common wire, separated by a distance from each other, and extending from the second common wire; a first additional wire electrically connected to the first common wire; and a second additional wire electrically connected to the second common wire.

6 Claims, 11 Drawing Sheets

(51) Int. Cl.
  *C23C 14/50* (2006.01)
  *H01L 21/67* (2006.01)
  *H01L 21/683* (2006.01)

(56) References Cited

U.S. PATENT DOCUMENTS

| | | | |
|---|---|---|---|
| 5,909,995 | A | 6/1999 | Wolf et al. |
| 6,274,198 | B1 | 8/2001 | Dautartas |
| 6,371,451 | B1 | 4/2002 | Choi |
| 6,749,906 | B2 | 6/2004 | Van Slyke |
| 6,995,035 | B2 | 2/2006 | Cok et al. |
| 7,964,037 | B2 | 6/2011 | Fukuda et al. |
| 2001/0006827 | A1 | 7/2001 | Yamazaki et al. |
| 2002/0076847 | A1 | 6/2002 | Yamada et al. |
| 2002/0135967 | A1* | 9/2002 | Fuwa et al. ................ 361/234 |
| 2002/0168577 | A1 | 11/2002 | Yoon |
| 2002/0194727 | A1 | 12/2002 | Cho et al. |
| 2003/0101937 | A1 | 6/2003 | Van Slyke et al. |
| 2003/0168013 | A1 | 9/2003 | Freeman et al. |
| 2003/0221614 | A1 | 12/2003 | Kang et al. |
| 2003/0232563 | A1 | 12/2003 | Kamiyama et al. |
| 2004/0123804 | A1 | 7/2004 | Yamazaki et al. |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0194702 | A1 | 10/2004 | Sasaki et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0166842 | A1 | 8/2005 | Sakamoto |
| 2005/0263074 | A1 | 12/2005 | Masuda et al. |
| 2006/0102078 | A1 | 5/2006 | Fairbairn et al. |
| 2006/0144325 | A1 | 7/2006 | Jung et al. |
| 2006/0164786 | A1 | 7/2006 | Kobayashi et al. |
| 2006/0174829 | A1 | 8/2006 | An et al. |
| 2006/0205101 | A1 | 9/2006 | Lee et al. |
| 2006/0255722 | A1 | 11/2006 | Imanishi |
| 2006/0278522 | A1 | 12/2006 | Kim et al. |
| 2007/0009652 | A1 | 1/2007 | Manz et al. |
| 2007/0046913 | A1 | 3/2007 | Shibazaki |
| 2007/0077358 | A1 | 4/2007 | Jeong et al. |
| 2007/0178708 | A1 | 8/2007 | Ukigaya |
| 2007/0275497 | A1 | 11/2007 | Kwack et al. |
| 2007/0297887 | A1 | 12/2007 | Tanaka |
| 2008/0018236 | A1 | 1/2008 | Arai et al. |
| 2008/0062609 | A1* | 3/2008 | Himori et al. ................ 361/234 |
| 2008/0115729 | A1 | 5/2008 | Oda et al. |
| 2008/0131587 | A1 | 6/2008 | Boroson et al. |
| 2008/0216741 | A1 | 9/2008 | Ling |
| 2008/0298947 | A1 | 12/2008 | Yeo et al. |
| 2009/0017192 | A1 | 1/2009 | Matsuura |
| 2009/0153033 | A1 | 6/2009 | Lee et al. |
| 2009/0229524 | A1 | 9/2009 | Kim et al. |
| 2009/0232976 | A1 | 9/2009 | Yoon et al. |
| 2010/0130020 | A1 | 5/2010 | Kim et al. |
| 2010/0156279 | A1 | 6/2010 | Tamura et al. |
| 2011/0052791 | A1* | 3/2011 | Jo et al. ................ 427/8 |

FOREIGN PATENT DOCUMENTS

| | | |
|---|---|---|
| EP | 1 518 940 A1 | 3/2005 |
| JP | 04-272170 | 9/1992 |
| JP | 10-120171 | 5/1998 |
| JP | 2000-068054 | 3/2000 |
| JP | 2001-052862 | 2/2001 |
| JP | 2001-093667 | 4/2001 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-347394 | 12/2003 |
| JP | 2004-043898 | 2/2004 |
| JP | 2004-103269 | 4/2004 |
| JP | 2004-103341 | 4/2004 |
| JP | 2004-199919 | 7/2004 |
| JP | 2004-342455 | 12/2004 |
| JP | 2005-044592 | 2/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2006-307247 | 11/2006 |
| JP | 2007-047293 | 2/2007 |
| JP | 2008-019477 | 1/2008 |
| JP | 2008-121098 | 5/2008 |
| JP | 2009-019243 | 1/2009 |
| JP | 2009-87910 | 4/2009 |
| JP | 2009-117231 | 5/2009 |
| JP | 2010-159167 | 7/2010 |
| KR | 10-1997-0008709 | 2/1997 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0088662 A | 11/2002 |
| KR | 10-2002-0090934 | 12/2002 |
| KR | 10-2003-0043012 | 6/2003 |
| KR | 10-0405080 B1 | 11/2003 |
| KR | 10-0406059 | 11/2003 |
| KR | 10-2003-0091947 | 12/2003 |
| KR | 10-2003-0093959 | 12/2003 |
| KR | 10-2004-0034537 | 4/2004 |
| KR | 10-0430336 A1 | 5/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-2005-0024324 | 3/2005 |
| KR | 10-0520159 B1 | 10/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 B1 | 11/2006 |
| KR | 10-0687007 B1 | 2/2007 |
| KR | 10-0696547 BI | 3/2007 |
| KR | 10-0698033 B1 | 3/2007 |
| KR | 10-0700466 B1 | 3/2007 |
| KR | 10-2007-0035796 | 4/2007 |
| KR | 10-0711885 B1 | 4/2007 |
| KR | 10-2007-0050793 | 5/2007 |
| KR | 10-0723627 B1 | 5/2007 |
| KR | 10-2007-0056190 | 6/2007 |
| KR | 10-0726132 B1 | 6/2007 |
| KR | 10-0741142 B1 | 7/2007 |
| KR | 10-2007-0078713 | 8/2007 |
| KR | 10-2007-0080635 | 8/2007 |
| KR | 10-0753160 | 8/2007 |
| KR | 10-2007-0091437 | 9/2007 |
| KR | 10-2007-0093904 | 9/2007 |
| KR | 10-2007-0101842 | 10/2007 |
| KR | 10-2007-0105595 | 10/2007 |
| KR | 10-0770653 B1 | 10/2007 |
| KR | 10-2008-0001184 | 1/2008 |
| KR | 10-2008-0007896 | 1/2008 |
| KR | 10-2008-0009285 | 1/2008 |
| KR | 10-0797787 B1 | 1/2008 |
| KR | 10-0800125 B1 | 1/2008 |
| KR | 10-0823508 B1 | 4/2008 |
| KR | 10-2008-0044239 | 5/2008 |
| KR | 10-2008-0046761 | 5/2008 |
| KR | 10-0827760 B1 | 5/2008 |
| KR | 10-2008-0057159 | 6/2008 |

(56) References Cited

FOREIGN PATENT DOCUMENTS

| KR | 10-0839380 B1 | 6/2008 |
|---|---|---|
| KR | 10-2008-0060400 | 7/2008 |
| KR | 10-2008-0061132 | 7/2008 |
| KR | 10-2008-0070302 | 7/2008 |
| KR | 10-2008-0073219 | 8/2008 |
| KR | 10-2008-0076574 | 8/2008 |
| KR | 10-2008-0104479 | 12/2008 |
| KR | 10-2008-0104695 | 12/2008 |
| KR | 10-2009-0038733 | 4/2009 |
| KR | 10-0899279 B1 | 5/2009 |
| KR | 10-2009-0066996 | 6/2009 |
| KR | 10-2009-0081717 | 7/2009 |
| KR | 10-2009-0094911 | 9/2009 |
| KR | 10-2009-0097453 | 9/2009 |
| KR | 10-2010-0002355 | 1/2010 |
| KR | 10-2010-0038088 | 4/2010 |
| KR | 10-2010-0044606 | 4/2010 |
| KR | 10-2010-0128589 | 12/2010 |
| KR | 10-101-7654 B1 | 2/2011 |
| KR | 10-2011-0022512 A | 3/2011 |
| KR | 10-2011-0022513 A | 3/2011 |
| WO | WO 03/043067 A1 | 5/2003 |
| WO | WO 2004/016406 | 2/2004 |

OTHER PUBLICATIONS

KIPO Registration Determination Certificate dated Jul. 2, 2012, for Korean Patent application 10-2010-0011481, (5 pages).
U.S. Office action dated Oct. 3, 2012, for cross reference U.S. Appl. No. 12/869,830, (28 pages).
European Search Report dated May 27, 2011, for European Patent application 10251514.5, 11 pages.
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
U.S. Office action dated Jun. 21, 2011, for cross-reference U.S. Appl. No. 12/862,153, 21 pages.
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2004, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 1020060126267, dated Dec. 7, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
Korean Patent Abstracts, Publication No. 10-2008-0070302, dated Jul. 30, 2008, corresponding to Korean Patent 10-0899279 B1 listed above.
Korean Patent Abstracts, Publication No. 10-0151312 B1, dated Jun. 18, 1998, corresponding to KR 10-1997-0008709 A listed above.
KIPO Office action dated Apr. 9, 2012, for Korean Patent application 10-2010-0031556, (4 pages).
KIPO Notice of Allowance dated Apr. 26, 2012, for Korean Patent application 10-2010-0066991, (5 pages).

\* cited by examiner

ELECTROSTATIC CHUCK, THIN FILM DEPOSITION APPARATUS INCLUDING THE ELECTROSTATIC CHUCK, AND METHOD OF MANUFACTURING ORGANIC LIGHT EMITTING DISPLAY APPARATUS BY USING THE THIN FILM DEPOSITION APPARATUS

CROSS-REFERENCE TO RELATED PATENT APPLICATION

This application claims priority to and the benefit of Korean Patent Application No. 10-2011-0044078, filed on May 11, 2011, in the Korean Intellectual Property Office, the disclosure of which is incorporated herein in its entirety by reference.

BACKGROUND

1. Field

Aspects of embodiments of the present invention relate to an electrostatic chuck, a thin film deposition apparatus including the electrostatic chuck, and a method of manufacturing an organic light emitting display apparatus by using the thin film deposition apparatus, and more particularly, to an electrostatic chuck capable of reducing or minimizing degradation of functions due to damage of the electrostatic chuck, a thin film deposition apparatus including the electrostatic chuck, and a method of manufacturing an organic light emitting display apparatus by using the thin film deposition apparatus.

2. Description of Related Art

In processes of manufacturing semiconductors or flat panel displays (such as liquid crystal displays (LCDs), plasma display panels (PDPs), or organic light emitting displays), mechanical chucks using clamps, vacuum chucks and/or electrical chucks using electric characteristics have been used in the manufacturing processes to stably attract and hold a substrate or a wafer. Conventional mechanical chucks have complex structures and take a long time to maintain, and vacuum chucks have a low attraction force and may deform the substrate.

Therefore, electrostatic chucks using an electrostatic force have been widely used recently. An electrostatic chuck is a tool for holding a substrate onto a lower electrode by using an electrostatic force. The electrostatic chuck may be classified as either a unipolar type electrostatic chuck that attracts the substrate onto the unipolar type electrostatic chuck by generating a potential difference between an electrode and the substrate, or a bipolar type electrostatic chuck that attracts the substrate onto the bipolar type electrostatic chuck by generating a potential difference between two or more electrodes. Since a unipolar electrostatic chuck has a weak electrostatic force and requires a high voltage, it is difficult to use the unipolar type electrostatic chuck on a large substrate. On the other hand, a bipolar type electrostatic chuck has a strong electrostatic force and may perform its holding function at a low voltage, and thus, the bipolar type electrostatic chuck may be used to attract and hold a large substrate onto the bipolar type electrostatic chuck.

However, fine electrodes formed on surfaces of the electrostatic chuck may be easily damaged.

SUMMARY

Aspects of embodiments of the present invention are directed toward an electrostatic chuck capable of reducing or minimizing a performance degradation area by a disconnection process when an electrode of the electrostatic chuck is damaged, a thin film deposition apparatus including the electrostatic chuck, and a method of manufacturing an organic light emitting display apparatus using the thin film deposition apparatus.

According to an embodiment of the present invention, there is provided an electrostatic chuck including: a first plate; a first common wire disposed on the first plate and electrically connected to a plus (+) terminal of an electric power source; a plurality of first electrode patterns electrically connected to the first common wire, separated by a set or predetermined distance from each other, and extending from the first common wire; a second common wire disposed on the first plate and electrically connected to a minus (−) terminal of the electric power source; a plurality of second electrode patterns electrically connected to the second common wire, separated by a predetermined distance from each other, and extending from the second common wire; a first additional wire electrically connected to the first common wire; and a second additional wire electrically connected to the second common wire.

Two end portions of the first additional wire may be respectively connected to two edges of the first common wire.

Two end portions of the second additional wire may be respectively connected to two edges of the second common wire.

The plurality of first electrode patterns and the plurality of second electrode patterns may be disposed alternately in parallel with each other.

The first electrode patterns may be perpendicular to the first common wire.

The electrostatic chuck may further include: a second plate on which a plurality of the first plates are disposed; a first connection wire disposed on the second plate so as to electrically connect the first common wires to each other; and a second connection wire disposed on the second plate so as to electrically connect the second common wires to each other.

According to another embodiment of the present invention, there is provided a thin film deposition apparatus including: an electrostatic chuck including: a first plate; a first common wire disposed on the first plate and electrically connected to a plus (+) terminal of an electric power source; a plurality of first electrode patterns electrically connected to the first common wire, separated by a set or predetermined distance from each other, and extending from the first common wire; a second common wire disposed on the first plate and electrically connected to a minus (−) terminal of the electric power source; a plurality of second electrode patterns electrically connected to the second common wire, separated by a set or predetermined distance from each other, and extending from the second common wire; a first additional wire electrically connected to the first common wire; and a second additional wire electrically connected to the second common wire. Here, the thin film deposition apparatus further includes: a plurality of chambers maintained in a vacuum state; at least one thin film deposition assembly disposed in at least one of the chambers, separated by a predetermined distance from a substrate, and for forming a thin film on the substrate supported by the electrostatic chuck; and a carrier for moving the electrostatic chuck to pass through the chambers, wherein the at least one thin film deposition assembly includes a patterning slit sheet smaller than the substrate in a direction parallel to a side of the substrate on which the thin film is deposited.

Two end portions of the first additional wire may be respectively connected to two edges of the first common wire.

Two end portions of the second additional wire may be respectively connected to two edges of the second common wire.

The plurality of first electrode patterns and the plurality of second electrode patterns may be disposed alternately in parallel with each other.

The first electrode patterns may be perpendicular to the first common wire.

The thin film deposition apparatus may further include: a second plate on which a plurality of the first plates are disposed; a first connection wire disposed on the second plate so as to electrically connect the first common wires to each other; and a second connection wire disposed on the second plate so as to electrically connect the second common wires to each other.

The carrier may include: a support disposed to penetrate through the chambers; a movement bar disposed on the support to support an edge of the electrostatic chuck; and a driving unit disposed between the support and the movement bar to move the movement bar along the support.

According to another embodiment of the present invention, there is provided a method of manufacturing an organic light-emitting display device, the method including: disposing a substrate on an electrostatic chuck which comprises: a first plate; a first common wire disposed on the first plate and electrically connected to a plus terminal of an electric power source; a plurality of first electrode patterns electrically connected to the first common wire, separated by a predetermined distance from each other, and extending from the first common wire; a second common wire disposed on the first plate and electrically connected to a minus terminal of the electric power source; a plurality of second electrode patterns electrically connected to the second common wire, separated by a predetermined distance from each other, and extending from the second common wire; a first additional wire electrically connected to the first common wire; and a second additional wire electrically connected to the second common wire. Here, the method further includes: conveying the electrostatic chuck on which the substrate is disposed to pass through a plurality of chambers that are maintained in a vacuum state; and forming an organic layer on the substrate by using a thin film deposition assembly disposed in at least one of the chambers, by a movement of the electrostatic chuck or the thin film deposition assembly with respect to each other, wherein the thin film deposition assembly includes a patterning slit sheet smaller than the substrate in a direction parallel to a side of the substrate on which the organic layer is deposited.

Two end portions of the first additional wire may be respectively connected to two edges of the first common wire.

Two end portions of the second additional wire may be respectively connected to two edges of the second common wire.

The plurality of first electrode patterns and the plurality of second electrode patterns may be disposed alternately in parallel with each other.

The first electrode patterns may be perpendicular to the first common wire.

The organic light-emitting display device may further include: a second plate on which a plurality of the first plates are disposed; a first connection wire disposed on the second plate so as to electrically connect the first common wires to each other; and a second connection wire disposed on the second plate so as to electrically connect the second common wires to each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings in which exemplary embodiments of the invention are shown.

Figure 1:
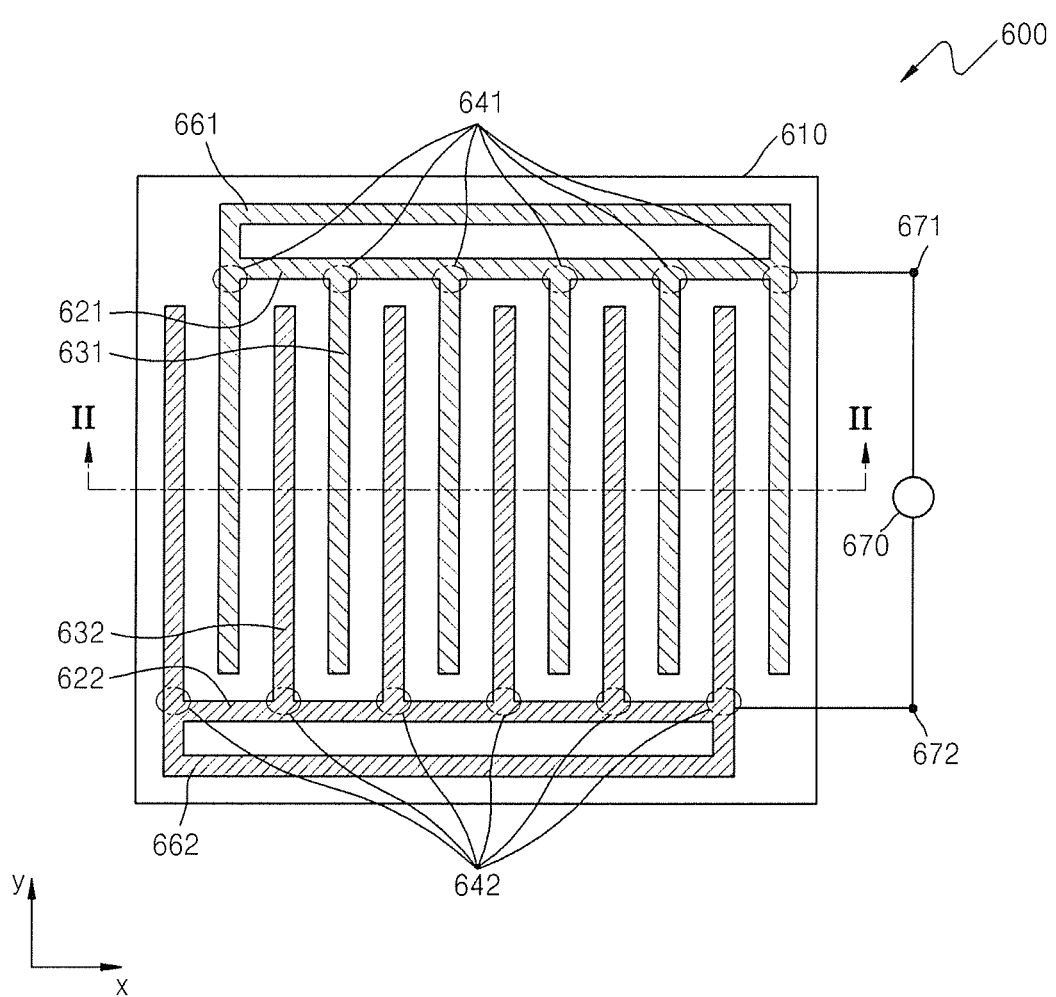
FIG. 1 is a schematic top view of an electrostatic chuck according to an embodiment of the present invention.
Figure 2:
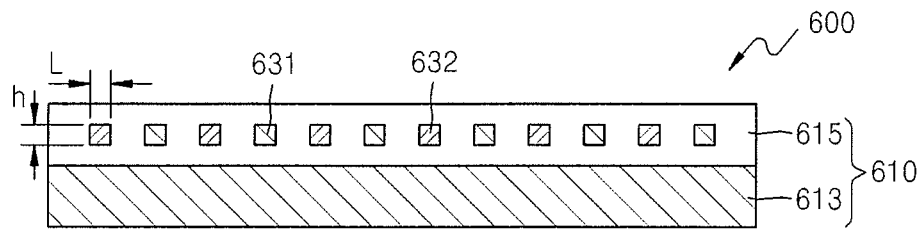
FIG. 2 is a cross-sectional view the electrostatic chuck taken along the line II-II of FIG. 1.

FIG. 1 is a schematic top view of an electrostatic chuck 600 according to an embodiment of the present invention, and FIG. 2 is a cross-sectional view of the electrostatic chuck taken along a line II-II of FIG. 1.

Referring to FIG. 1, the electrostatic chuck 600 according to the present embodiment includes a first plate 610, a first common wire 621 electrically connected to a plus (+) terminal 671 of an electric power source 670, first electrode patterns 631 arranged at regular intervals along the first common wire 621, a second common wire 622 electrically connected to a minus (−) terminal 672 of the electric power source 670, second electrode patterns 632 arranged at regular intervals along the second common wire 622, a first additional wire 661, and a second additional wire 662.

Referring to FIG. 2, the first plate 610 includes a supporting member 613 and an insulating member 615 formed on the supporting member 613. The first electrode patterns 631 and the second electrode patterns 632 are included in the insulating member 615.

The first plate 610 is a body of the electrostatic chuck 600 that supports the substrate that is a target substrate. Therefore, the first plate 610 may be equal to a size of the substrate or greater. The first plate 610 is shown as being a square plate; however, the present invention is not limited thereto. In other words, the first plate 610 may be formed as a circular, oval, or polygonal plate so as to correspond to a planar shape of the target substrate.

An adhesive layer may be further formed between the supporting member 613 and the insulating member 615.

The supporting member 613 may be formed of graphite or metal such as aluminum (Al) or steel use stainless (SUS), and the insulating member 615 is a ceramic plate formed of alumina ($Al_2O_3$). Since $Al_2O_3$ has excellent electric insulating property, chemical stability, and abrasion resistance at a high temperature, it is suitable for forming the insulating member 615.

In the electrostatic chuck 600 shown in FIGS. 1 and 2, the first common wire 621, the second common wire 622, the first additional wire 661, and the second additional wire 662 may be formed in the insulating member 615.

The first and second electrode patterns 631 and 632, the first and second common wires 621 and 622, and/or the first and second additional wires 661 and 662 may be formed of tungsten (W) or other conductive materials such as molybdenum (Mo) or titanium (Ti).

The first and second common wires 621 and 622 are disposed at two opposite edges of the first plate 610, and may extend in an x-axis direction.

The plurality of first electrode patterns 631 are arranged at regular intervals along the first common wire 621. Each of the first electrode patterns 621 includes a first connection portion 641 that is electrically connected to the first common wire 621 at an end portion thereof, and is extended from the first connection portion 641 in a y-axis direction.

Likewise, the plurality of second electrode patterns 632 are arranged at regular intervals along the second common wire 622. Each of the second electrode patterns 632 includes a second connection portion 642 that is electrically connected to the second common wire 622 at an end portion thereof, and is extended from the second connection portion 642 in the y-axis direction.

A width L (FIG. 2) of the first electrode pattern 631 or the second electrode pattern 632 may be 0.5 mm to 2 mm. It is technically difficult to form the width L to be less than 0.5 mm, and if the width L is greater than 2 mm, the electrostatic force becomes weak and thus, reduces the attraction force.

A height h (FIG. 2) of the first electrode pattern 631 or the second electrode pattern 632 may be 30 µm to 50 µm. If the height h is less than 30 µm, resistance increases due to pores in an electrode layer and other defects, and thus, degrading the attraction force. In addition, if the height h is greater than 50 µm, an overcurrent may occur, thus generating an arcing operation. The present invention is not limited to the above width L and the height h, and the width L and the height h may vary depending on a structure of the electrostatic chuck and a material for forming the electrostatic chuck.

According to the electrostatic chuck 600 of the present embodiment, the first and second electrode patterns 631 and 632 are alternately arranged on the same plane. However, the first and second electrode patterns 631 and 632 may be located at different levels from each other, and may be formed to be parallel with each other or cross each other.

Two end portions of the first additional wire 661 are respectively connected to two edges of the first common wire 621. All of the first connection portions 641 may be located between two end portions of the first additional wire 661.

In the embodiment shown in FIG. 1, the first additional wire 661 is formed as a straight line; however, the present invention is not limited thereto, and the first additional wire may be formed as a curve. The first additional wire 661 is electrically connected to the first electrode patterns 631 and the electric power source 670, like the first common wire 621.

The second additional wire 662 is the same as the first additional wire 661, and thus, a detailed description thereof is not provided here.

Figure 3:
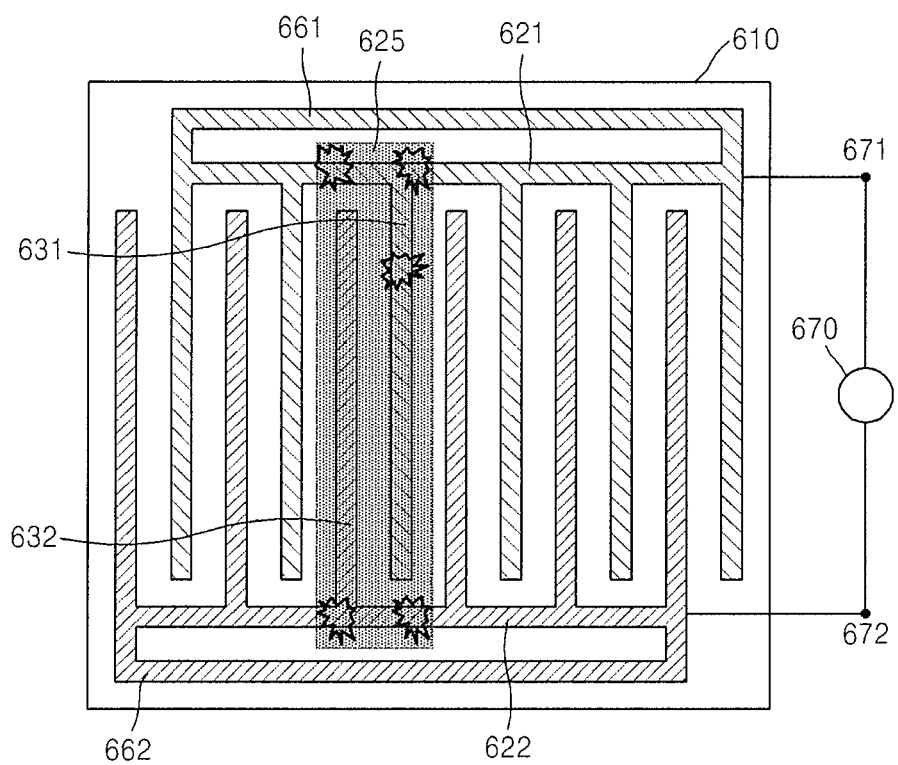
FIG. 3 is a diagram illustrating a voltage non-applied region formed by a disconnection process when the electrostatic chuck of FIG. 1 is damaged.

FIG. 3 is a schematic diagram illustrating a voltage non-application region 625 due to a disconnection process when the electrostatic chuck 600 of FIG. 1 is damaged.

For example, when a part of the first electrode pattern 631 is damaged, a part of the first common wire 621 may be disconnected so that a voltage is not applied to the damaged first electrode pattern 631 in order to prevent an arc from generating due to a current leakage and a high voltage application. Here, a part of the second common wire 622 may be disconnected so that the voltage is not applied to a corresponding part of the second electrode pattern 632.

Since the voltage may be applied to both sides of the first and second common wires 621 and 622 due to the first and second additional wires 661 and 662, the first common wire 621 connected to the damaged first electrode pattern 631, and the second common wire 622 connected to the second electrode pattern 632 corresponding to the damaged first electrode pattern 631, are disconnected. Therefore, when a part of the first electrode pattern 631 is damaged, the arc generation due to the leakage current and the high voltage application may be prevented by performing the disconnection process.

The above-described disconnection process may be applied to a case where a part of the second electrode pattern 632 is damaged.

Due to the above disconnection process, the voltage non-application region 625 including the damaged first electrode pattern 631 is generated. Therefore, the electrostatic force may not be generated on the damaged portion of the first electrode pattern 631 because the voltage is not applied thereto, and thus, the damaged portion loses its function as an electrostatic chuck. However, even if a part of the first common wire 621 is disconnected, the voltage may be applied to the first electrode patterns 631 at another region than the voltage non-application region 625 by using the first additional wire 661.

The above-described process also applies to the second additional wire 662. In other words, as shown in FIG. 3, even if a part of the second common wire 622 is disconnected, the voltage may be applied to other second electrode patterns 632 at another region than the voltage non-application region 625 by using the second additional wire 662.

According to the electrostatic chuck 600 of the present embodiment, even when a common wire is connected at a region (where no voltage is applied due to damage to a part of the electrode patterns) or at a region (where there is damage and is disconnected), the overall electrostatic chuck can still be used.

Figure 4:
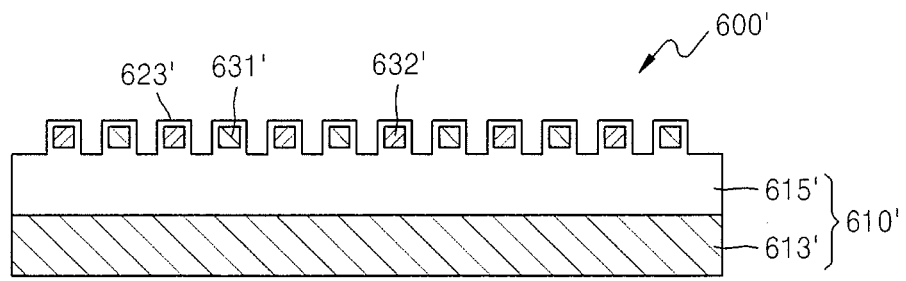
FIG. 4 is a schematic cross-sectional view of an electrostatic chuck according to another embodiment of the present invention.

FIG. 4 is a schematic cross-sectional view of an electrostatic chuck 600' according to another embodiment of the present invention.

Referring to FIG. 4, the structure of the electrostatic chuck 600' is the same as that of the embodiment shown in FIG. 1, except that first electrode patterns 631' and second electrode patterns 632' are included in protrusions 623' that protrude from a surface of a first plate 610'.

A first common wire 621', a second common wire 622', a first additional wire 661', and a second additional wire 662' may also be included in the protrusions 623'.

The first and second electrode patterns 631' and 632' are formed on a surface of an insulating member 615', and the protrusions 623' cover the first and second electrode patterns 631' and 632'. The protrusions 623' insulate the first and second electrode patterns 631' and 632' from each other and protect the first and second electrode patterns 631' and 632', and may be formed of the same material as that of the insulating member 615'.

Through the above-described structure, the electrostatic force may be induced evenly throughout the entire surface of the electrostatic chuck 600', thus performing a stable chucking operation.

Figure 5:
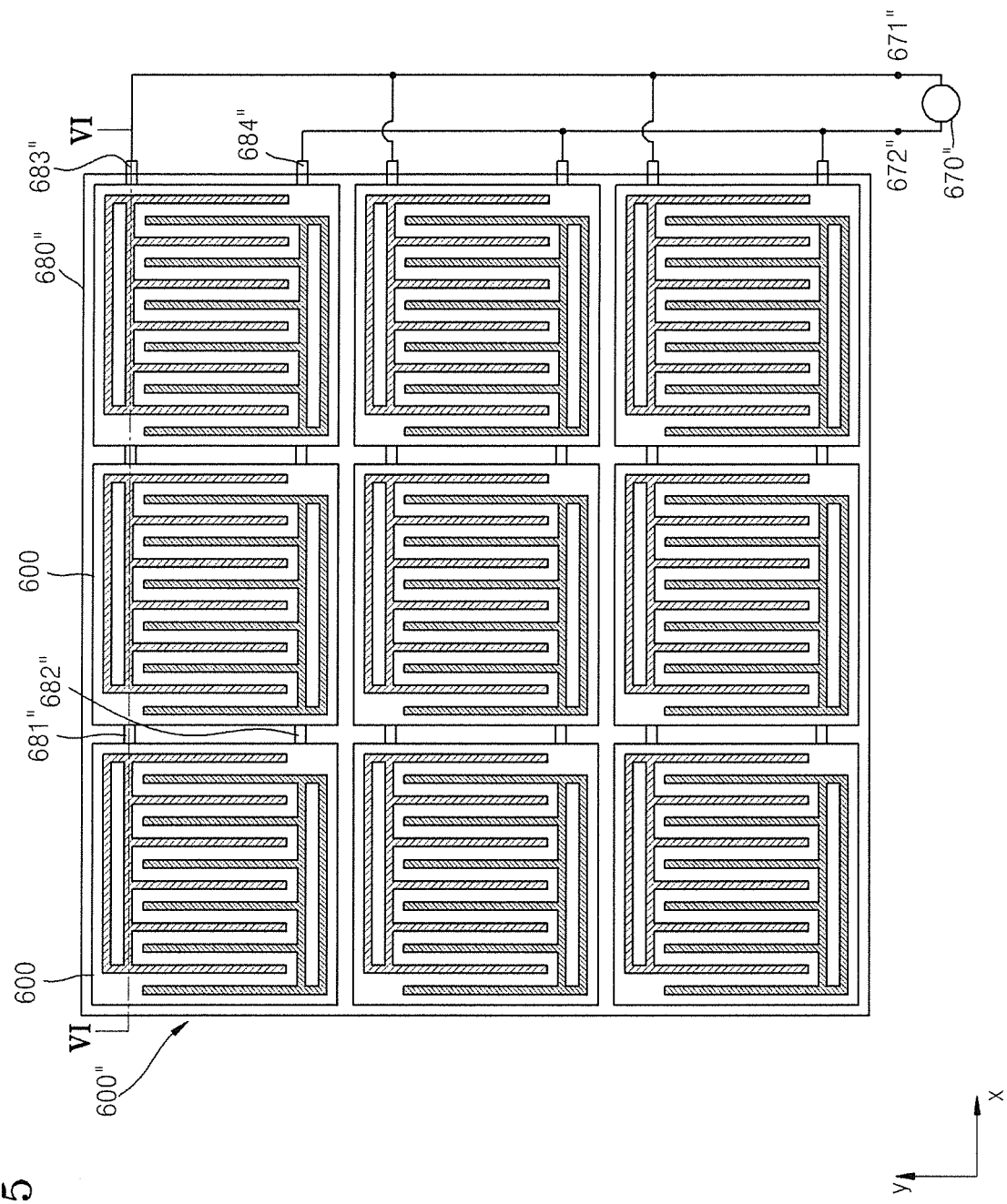
FIG. 5 is a schematic top view of an electrostatic chuck according to another embodiment of the present invention.
Figure 6:
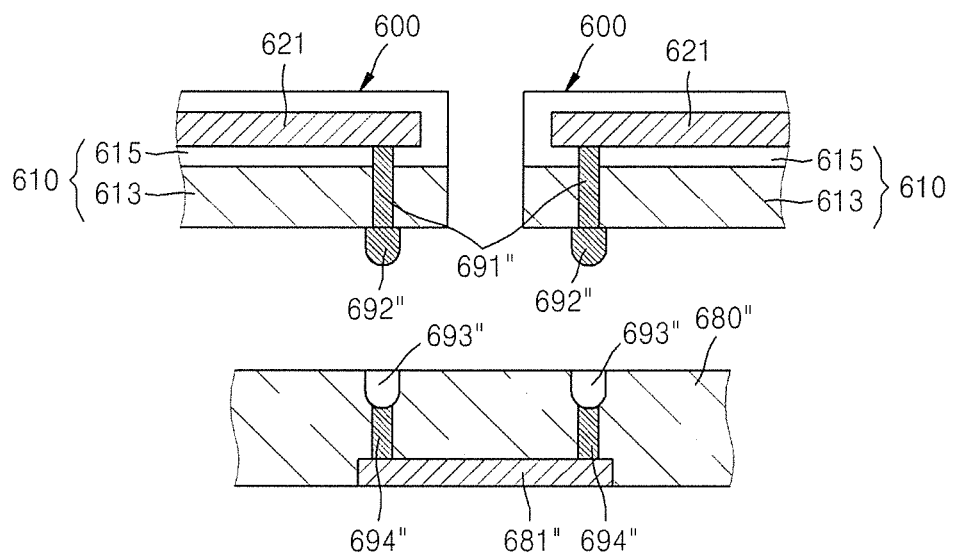
FIG. 6 is a schematic cross-sectional pre-attached view of a part of the electrostatic chuck taken along line VI-VI of FIG. 5.

FIG. 5 is a schematic plan top view of an electrostatic chuck 600" according to another embodiment of the present invention, and FIG. 6 is a schematic pre-attached cross-sectional view of the electrostatic chuck 600" taken along line VI-VI of FIG. 5.

Referring to FIG. 5, a plurality of electrostatic chucks 600, one of which as illustrated in FIG. 1, are disposed on a second plate 680". The second plate 680" includes a first connection wire 681" for electrically connecting first common wires 621 of the electrostatic chucks 600, and a second connection wire 682" for electrically connecting second common wires 622 of the electrostatic chucks 600.

Since the plurality of electrostatic chucks 600 are disposed on the second plate 680" that is large, a flatness may be evenly maintained for all regions of the electrostatic chuck 600 when the target substrate is, for example, a large substrate.

Referring to FIG. 6, the first common wire 621 of the electrostatic chuck 600 according to the embodiment of FIG. 1 is electrically connected to a protrusion terminal 692" via an embedded wire 691" that is disposed inside the first plate 610. The protrusion terminal 692" is formed to correspond to a recess 693" formed in the second plate 680" so as to be mounted in the recess 693". An embedded wire 694" is formed under the recess 693" inside the second plate 680", and the embedded wire 694" is connected to the first connection wire 681" (FIG. 5).

Therefore, the second plate 680" and the first plate 610 may be attached/detached to/from each other, and when the second plate 680" and the first plate 610 are attached to each other, the first common wire 621 is electrically connected to the first connection wire 681".

The first connection wire 681" electrically connects all electrostatic chucks 600 that are adjacent to each other in the x-axis direction to each other, and then, is connected to a plus terminal 671" of a electric power source 670" via an external terminal 683".

The above-described structure also applies to the second common wire 622. The second common wires 622 are connected to each other via the second connection wire 682", and connected to a minus terminal 672" of the electric power source 670" via an external terminal 684".

The above-described electrostatic chucks 600, 600' and 600" may be used in a thin film deposition apparatus.

Figure 7:
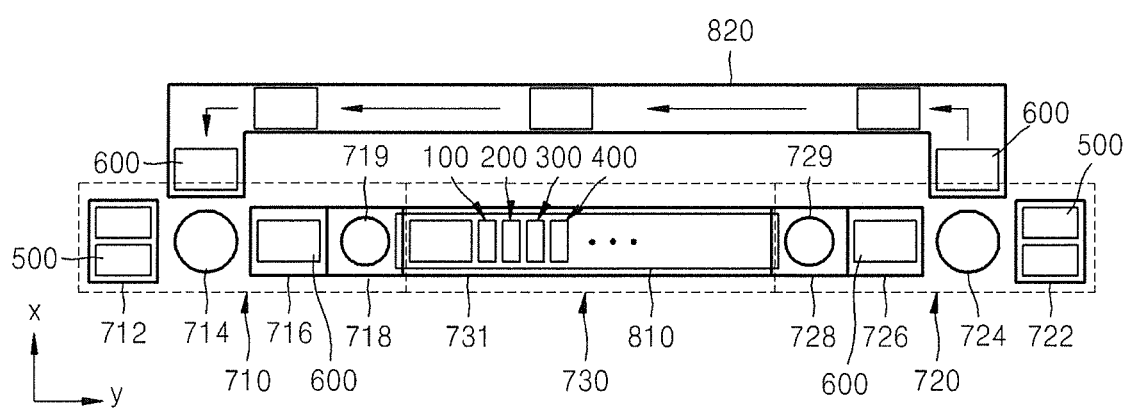
FIG. 7 is a schematic diagram of a thin film deposition apparatus including an electrostatic chuck according to an embodiment of the present invention.
Figure 8:
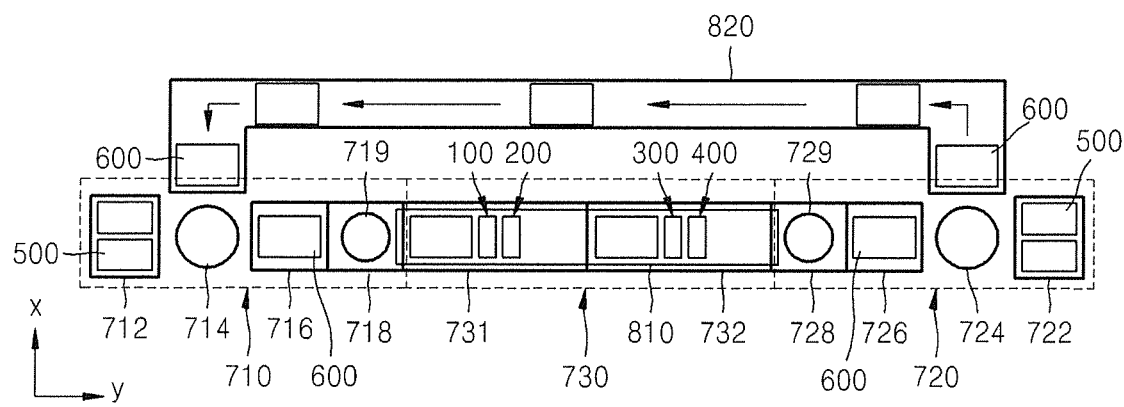
FIG. 8 is a schematic diagram of a thin film deposition apparatus including an electrostatic chuck according to another embodiment of the present invention.

FIG. 7 is a schematic diagram of a thin film deposition apparatus including an electrostatic chuck according to an embodiment of the present invention, and FIG. 8 is a schematic diagram of a thin film deposition apparatus including an electrostatic chuck according to another embodiment of the present invention.

Referring to FIG. 7, the thin film deposition apparatus according to the current embodiment includes a loading unit 710, a deposition unit 730, an unloading unit 720, a first conveyer unit 810, and a second conveyer unit 820.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes it on an electrostatic chuck 600 transferred by the second conveyor unit 820, and moves the electrostatic chuck 600 on which the substrate 500 is disposed into the transport chamber 716. Although not shown in the drawings, the transport robot 714 may be disposed in a chamber in which a set or predetermined degree of vacuum is maintained.

Although the electrostatic chuck is referenced with the number "600" for ease of description, the present invention is not thereby limited and the electrostatic chuck may actually be the electrostatic chuck 600, 600' or 600" shown in FIG. 1, FIG. 4 or FIG. 5.

The first inversion chamber 718 is disposed adjacent to the transport chamber 716. The first inversion chamber 718 includes a first inversion robot 719 that inverts the electrostatic chuck 600 and then loads it into the first conveyer unit 810 of the deposition unit 730.

Referring to FIG. 7, the transport robot 714 places one of the substrates 500 on the surface of the electrostatic chuck 600, and the electrostatic chuck 600 on which the substrate 500 is disposed, is loaded into the transport chamber 716. The first inversion robot 719 inverts the electrostatic chuck 600 so that the substrate 500 is turned upside down in the deposition unit 730. The transport chamber 716 and the first inversion chamber 718 may be maintained at a set or predetermined degree of vacuum.

The unloading unit 720 is constituted to operate in an opposite manner to the loading unit 710 described above. Specifically, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into a second rack 722. The electrostatic chuck 600 separated from the substrate 500 is returned back into the loading unit 710 via the second conveyer unit 820. Both of the second inversion chamber 728 and the ejection chamber 726 may be maintained at a set or predetermined degree of vacuum. In addition, although it is not shown in the drawings, the ejection robot 724 may be disposed in a chamber that is maintained at a set or predetermined degree of vacuum.

However, the present invention is not limited to the above description. For example, when disposing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729, are not used.

The deposition unit 730 may include at least one deposition chamber. As illustrated in FIG. 7, the deposition unit 730 may include a first chamber 731. In this case, first to four thin film deposition assemblies 100, 200, 300, and 400 may be disposed in the first chamber 731. Although FIG. 7 illustrates that a total of four thin film deposition assemblies, i.e., the first to fourth thin film deposition assemblies 100 to 400, are installed in the first chamber 731, the total number of thin film deposition assemblies that may be installed in the first chamber 731 may vary according to the deposition material and deposition conditions. The first chamber 731 is maintained in a vacuum state during a deposition process.

In the thin film deposition apparatus illustrated in FIG. 8, the deposition unit 730 may include the first chamber 731 and a second chamber 732 that are connected to each other. In this case, first and second thin film deposition assemblies 100 and 200 may be disposed in the first chamber 731, and third and fourth thin film deposition assemblies 300 and 400 may be disposed in the second chamber 732. In this regard, more than two chambers may be disposed.

In the embodiment illustrated in FIG. 7, the electrostatic chuck 600 on which the substrate 500 is disposed may be moved at least to the deposition unit 730 or may be moved sequentially to the loading unit 710, the deposition unit 730, and the unloading unit 720, by the first conveyor unit 810. The electrostatic chuck 600 that is separated from the substrate 500 in the unloading unit 720 is moved back to the loading unit 710 by the second conveyor unit 820.

Figure 9:
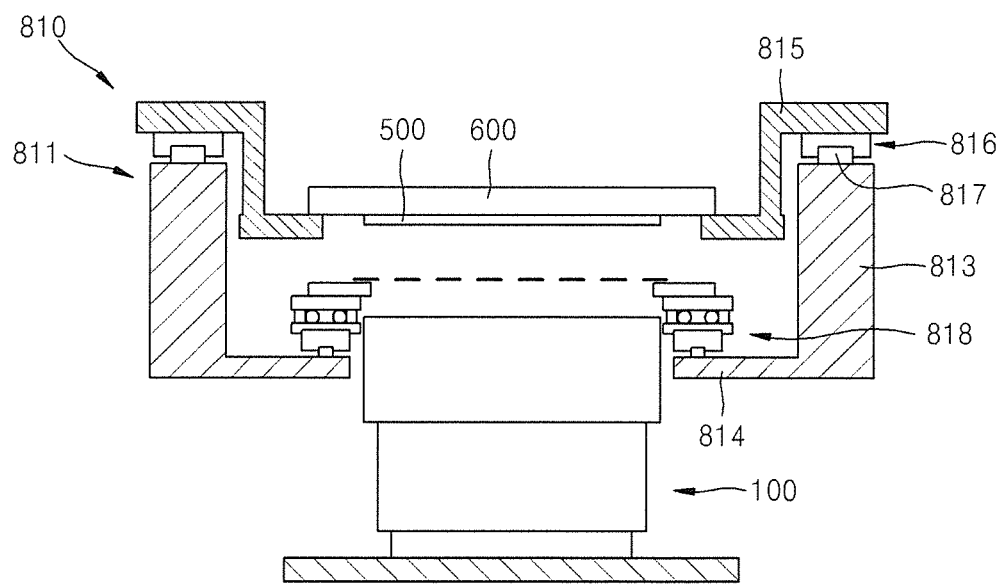
FIG. 9 is a cross-sectional view of a first conveyer unit according to an embodiment of the present invention.

FIG. 9 is a cross-sectional view of the first conveyer unit 810 according to an embodiment of the present invention.

The first conveyor unit 810 includes a first carrier 811 that moves the electrostatic chuck 600 on which the substrate 500 is disposed.

The first carrier 811 includes a first support 813, a second support 814, a movement bar 815, and a first driving unit 816.

The first and second supports 813 and 814 are installed to penetrate through a chamber of the deposition unit 730, for example, the first chamber 731 in the embodiment shown in FIG. 7, and the first and second chambers 731 and 732 in the embodiment shown in FIG. 8.

The first support 813 is vertically disposed in the upper portion of the first chamber 731, and the second support 814 is horizontally disposed below the first support 813 in the first chamber 731. As illustrated in FIG. 9, the first support 813 and the second support 814 may be disposed perpendicular to each other to form a bent structure. However, the present invention is not limited to this structure, and the first support 813 and the second support 814 may have any suitable structure, provided that the first support 813 is disposed above the second support 814.

The movement bar 815 is movable along the first support 813. One end of the movement bar 815 is supported by the first support 813, and the other end of the movement bar 815 supports an edge of the electrostatic chuck 600. The electrostatic chuck 600 is supported by the movement bar 815 to be movable along the first support 813. A portion of the movement bar 815 supporting the electrostatic chuck 600 is bent toward the thin film deposition assembly 100, and thus, can move the substrate 500 closer to the thin film deposition assembly 100.

The first driving unit 816 is disposed between the movement bar 815 and the first support 813. The first driving unit 816 may include a roller 817 rolling along the first support 813. The first driving unit 816 moves the movement bar 815 along the first support 813. The first driving unit 816 may generate a driving force by itself or may transfer a driving force generated by a separate driving source to the movement bar 815. Here, the first driving unit 816 is not limited to the roller 817 and may include any suitable driving element that can move the movement bar 815.

Figure 10:
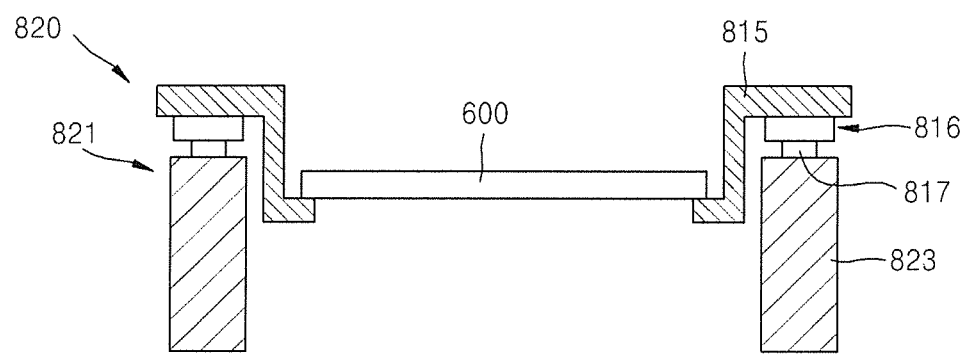
FIG. 10 is a cross-sectional view of a second conveyer unit according to an embodiment of the present invention.

FIG. 10 is a cross-sectional view of the second conveyer unit 820 according to an embodiment of the present invention.

The second conveyor unit 820 includes a second carrier 821 that moves the electrostatic chuck 600 that is separated from the substrate 500.

The second carrier 821 includes a third support 823, the movement bar 815, and a first driving unit 816.

The third support 823 extends equally with the first support 813 of the first carrier 811. The third support 823 supports the movement bar 815 including the first driving unit 816, and the electrostatic chuck 600 that is separated from the substrate 500 is disposed on the movement bar 815. Structures of the movement bar 815 and the first driving unit 816 are described above.

A system for moving the electrostatic chuck 600 is not limited to the above-described structures, for example, the electrostatic chuck 600 may be moved by an additional roller or a chain system along a rail.

Hereinafter, an embodiment of the thin film deposition assembly 100 disposed in the first chamber 731 will be described.

Figure 11:
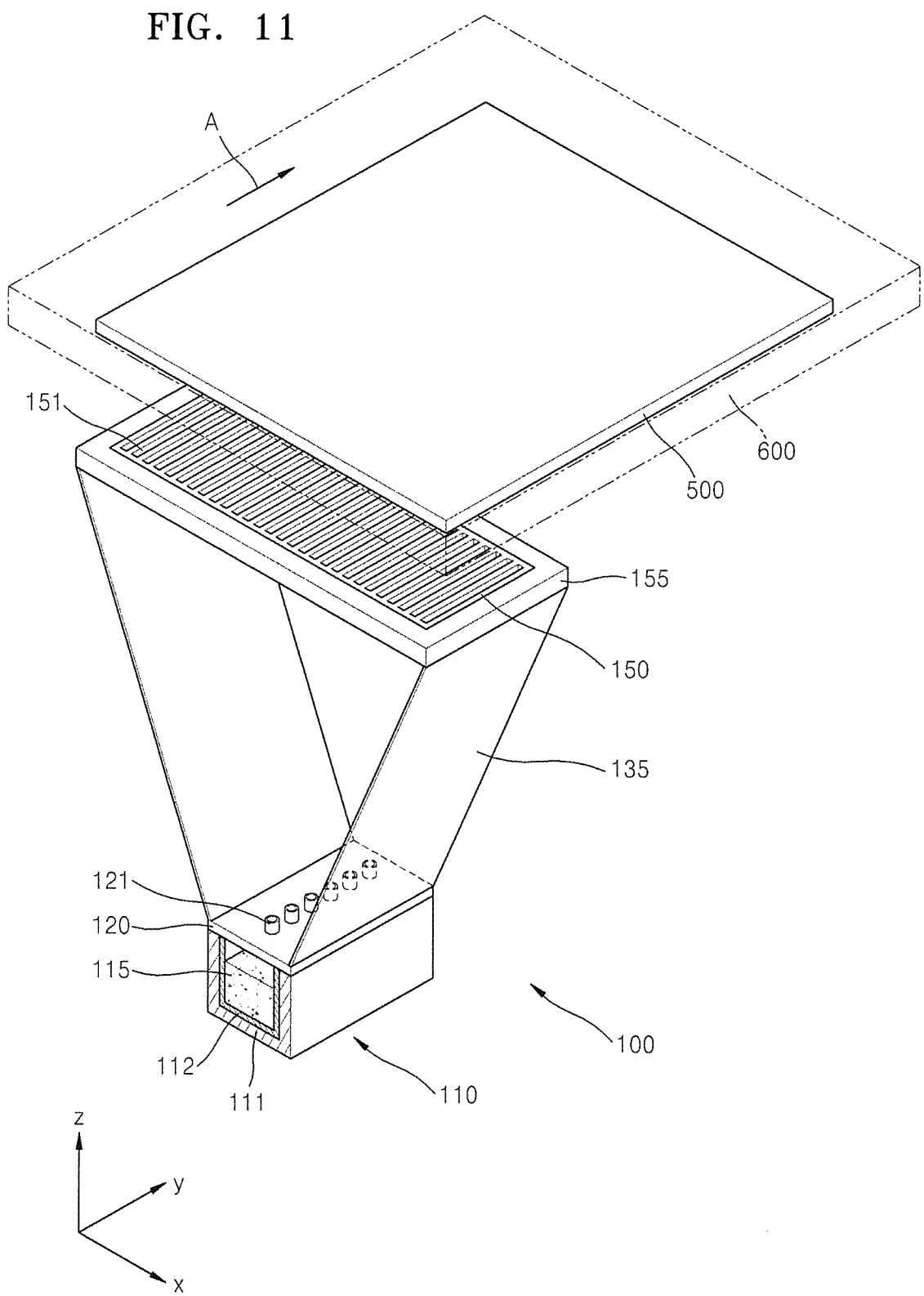
FIG. 11 is a schematic perspective view of a thin film deposition assembly according to an embodiment of the present invention.

FIG. 11 is a schematic perspective view of the thin film deposition assembly 100 according to an embodiment of the present invention.

Referring to FIG. 11, the thin film deposition assembly 100 according to the current embodiment includes a deposition source 110, a deposition source nozzle unit 120, and a patterning slit sheet 150.

In particular, in order to deposit a deposition material 115 that is emitted from the deposition source 110 and is discharged through the deposition source nozzle unit 120 and the patterning slit sheet 150, onto a substrate 500 in a desired pattern, the first chamber 731 should be maintained in a high-vacuum state as in a deposition method using a fine metal mask (FMM). In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500, which is a deposition target on which the deposition material 115 is to be deposited, is disposed in the first chamber 731. The substrate 500 may be a substrate for flat panel displays. A large substrate, such as a mother glass, for manufacturing a plurality of flat panel displays, may be used as the substrate 500. Other suitable substrates may also be employed.

In the thin film deposition assembly 100 according to the current embodiment of the present invention, deposition may be performed while the thin film deposition assembly 100 or the substrate 500 is moved relative to the other. Deposition may be continuously performed while the substrate 500, which is disposed to face the thin film deposition assembly 100, is moved in a y-axis direction. In other words, deposition may be performed in a scanning manner while the substrate 500 is moved in a direction of arrow A in FIG. 11.

In the thin film deposition assembly 100 according to the current embodiment of the present invention, the patterning slit sheet 150 may be significantly smaller than an FMM used in a conventional deposition method. In other words, in the thin film deposition assembly 100 according to the current embodiment of the present invention, deposition is continuously performed, i.e., in a scanning manner while the substrate 500 is moved in the y-axis direction. Thus, lengths of the patterning slit sheet 150 in the x-axis and y-axis directions may be significantly less than the lengths of the substrate 500 in the x-axis and y-axis directions. As described above, since the patterning slit sheet 150 may be formed to be significantly smaller than an FMM used in a conventional deposition method, it is relatively easy to manufacture the patterning slit sheet 150 used in the present invention. In other words, using the patterning slit sheet 150, which is smaller than an FMM used in a conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110 that contains and heats the deposition material 115 is disposed at an opposite side of the chamber to a side at which the substrate 500 is disposed. While being vaporized in the deposition source 110, the deposition material 115 is deposited on the substrate 500.

In more detail, the deposition source 110 includes a crucible 112 that is filled with the deposition material 115, and a cooling block 111 that heats the crucible 112 to vaporize the deposition material 115, which is contained in the crucible 112, towards a side of the crucible 112, and in particular, towards the deposition source nozzle unit 120. The cooling block 111 reduces or prevents radiation of heat from the crucible 112 to the outside, e.g., into the first chamber 731. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals in the y-axis direction, i.e., a scanning direction of the substrate 500. The deposition material 115 that vaporizes in the deposition source 110 passes through the deposition source nozzle unit 120 towards the substrate 500 that is a deposition target. As described above, when the deposition source nozzle unit 120 includes the plurality of deposition source nozzles 121 arranged in the y-axis direction, that is, the scanning direction of the substrate 500, the size of a pattern formed of the deposition material discharged through the patterning slits 151 of the patterning slit sheet 150 is affected by the size of one of the deposition source nozzles 121 (since there is only one of deposition nozzles in the x-axis direction), and thus, no shadow zone may be formed on the substrate 500. In addition, since the plurality of deposition source nozzles 121 are arranged in the scanning direction of the substrate 500, even there is a difference in flux between the deposition source nozzles 121, the difference may be compensated for and deposition uniformity may be maintained constant.

The patterning slit sheet 150 and a frame 155 in which the patterning slit sheet 155 is included are disposed between the deposition source 110 and the substrate 500. The frame 155 may be formed to have a lattice shape, similar to a window frame. The patterning slit sheet 150 includes the patterning slits 151 arranged in the x-axis direction. The deposition material 115 that is vaporized in the deposition source 110, passes through the deposition source nozzle unit 120 and the patterning slit sheet 150 towards the substrate 500 that is the deposition target (on which the deposition material 115 is to be deposited). The patterning slit sheet 150 may be manufactured by etching, which is the same method as used in a conventional method of manufacturing an FMM, and in particular, a striped FMM. In this regard, the total number of patterning slits 151 may be greater than the total number of deposition source nozzles 121.

In addition, the deposition source 110 and the deposition source nozzle unit 120 attached to the deposition source 110 may be disposed separate from the patterning slit sheet 150 by a set or predetermined distance. Alternatively, the deposition source 110 and the deposition source nozzle unit 120 attached to the deposition source 110 may be connected to the patterning slit sheet 150 by a first connection member 135. In other words, the deposition source 110, the deposition source nozzle unit 120, and the patterning slit sheet 150 may be integrally formed as one body by being connected to each other with (via) the first connection member 135. The first connection member 135 guides the deposition material 115, which is discharged through the deposition source nozzles 121, to move straight and to not flow in the x-axis direction. In FIG. 11, the first connection member 135 is formed on the left and right sides of the deposition source 110, the deposition source nozzle unit 120, and the patterning slit sheet 150 to guide the deposition material 115 not to flow in the x-axis direction; however, aspects of the present invention are not limited thereto. In other words, the first connection member 135 may be formed as a sealed box to guide flow of the deposition material 115 both in the x-axis and y-axis directions.

As described above, the thin film deposition assembly 100 according to the current embodiment of the present invention performs deposition while being moved relative to the substrate 500. In order to move the thin film deposition assembly 100 relative to the substrate 500, the patterning slit sheet 150 is separated from the substrate 500 by a set or predetermined distance.

As described above, according to the present invention, a mask is formed to be smaller than a substrate, and deposition is performed while the mask is moved relative to the substrate. Thus, the mask can be easily manufactured. In addition, defects caused due to the contact between a substrate and an FMM, which occur in the conventional deposition method, may be reduced or prevented. In addition, since it is unnecessary to contact the substrate with the mask during a deposition process, manufacturing speed may be increased.

Figure 12:
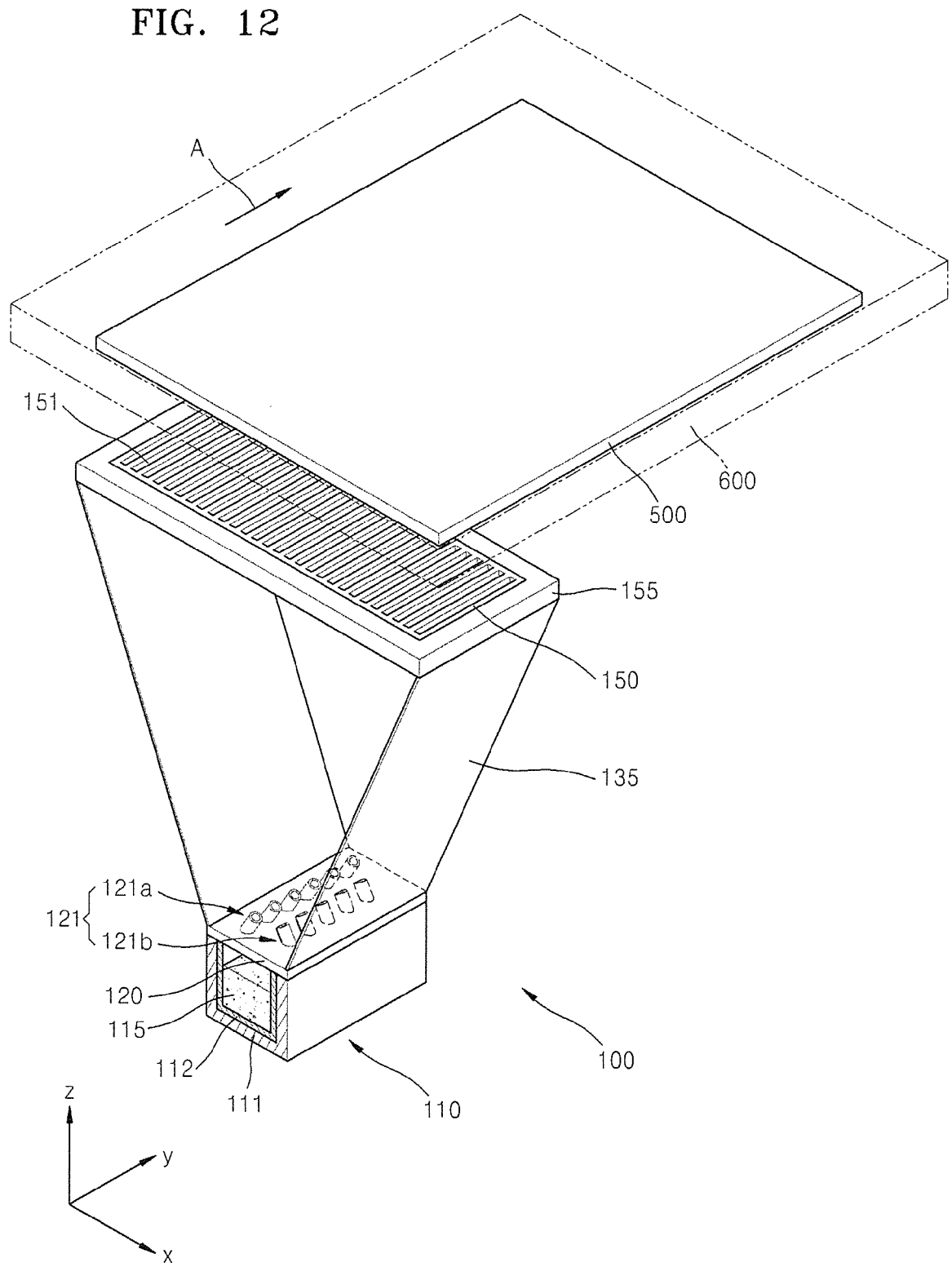
FIG. 12 is a schematic perspective view of a thin film deposition assembly according to another embodiment of the present invention.

FIG. 12 is a schematic perspective view of a thin film deposition assembly 100 according to another embodiment of the present invention.

Referring to FIG. 12, the thin film deposition assembly 100 according to the current embodiment of the present invention includes the deposition source 110, the deposition source nozzle unit 120, and the patterning slit sheet 150. Here, the deposition source 110 includes the crucible 112 that is filled with the deposition material 115, and the cooling block 111 that heats the crucible 112 to vaporize the deposition material 115, which is contained in the crucible 111, so as to move the vaporized deposition material 115 to the deposition source nozzle unit 120. The deposition source nozzle unit 120 is disposed at a side of the deposition source 110. The deposition source nozzle unit 120 includes a plurality of deposition source nozzles 121 arranged in the y-axis direction. The patterning slit sheet 150 and the frame 155 are further disposed between the deposition source 110 and the substrate 500. The patterning slit sheet 150 includes the patterning slits 151 arranged in the x-axis direction. In addition, the deposition source 110 and the deposition source nozzle unit 120 may be connected to the patterning slit sheet 150 by a second connection member 135.

In the current embodiment, the plurality of deposition source nozzles 121 formed on the deposition source nozzle unit 120 are tilted at a set or predetermined angle, unlike the thin film deposition assembly 100 described with reference to FIG. 11. In particular, the deposition source nozzles 121 may include deposition source nozzles 121a and 121b arranged in respective rows. The deposition source nozzles 121a and 121b may be arranged in respective rows to alternate in a zigzag pattern. The deposition source nozzles 121a and 121b may be tilted at a set or predetermined angle on an xz plane. The deposition source nozzles 121a in a first row and the deposition source nozzles 121b in a second row may tilt to face each other. In other words, the deposition source nozzles 121a of the first row in a left part of the deposition source nozzle unit 120 are arranged to face a right side portion of the patterning slit sheet 150, and the deposition source nozzles 121b of the second row in a right part of the deposition source nozzle unit 120 are arranged to face a left side portion of the patterning slit sheet 150.

Due to the structure of the thin film deposition assembly 100 according to the current embodiment, the deposition of the deposition material 115 may be adjusted to lessen a thickness variation between the center and the end portions of the substrate 500 and improve thickness uniformity of the deposition film. Moreover, the utilization efficiency of the deposition material 115 may also be improved.

Figure 13:
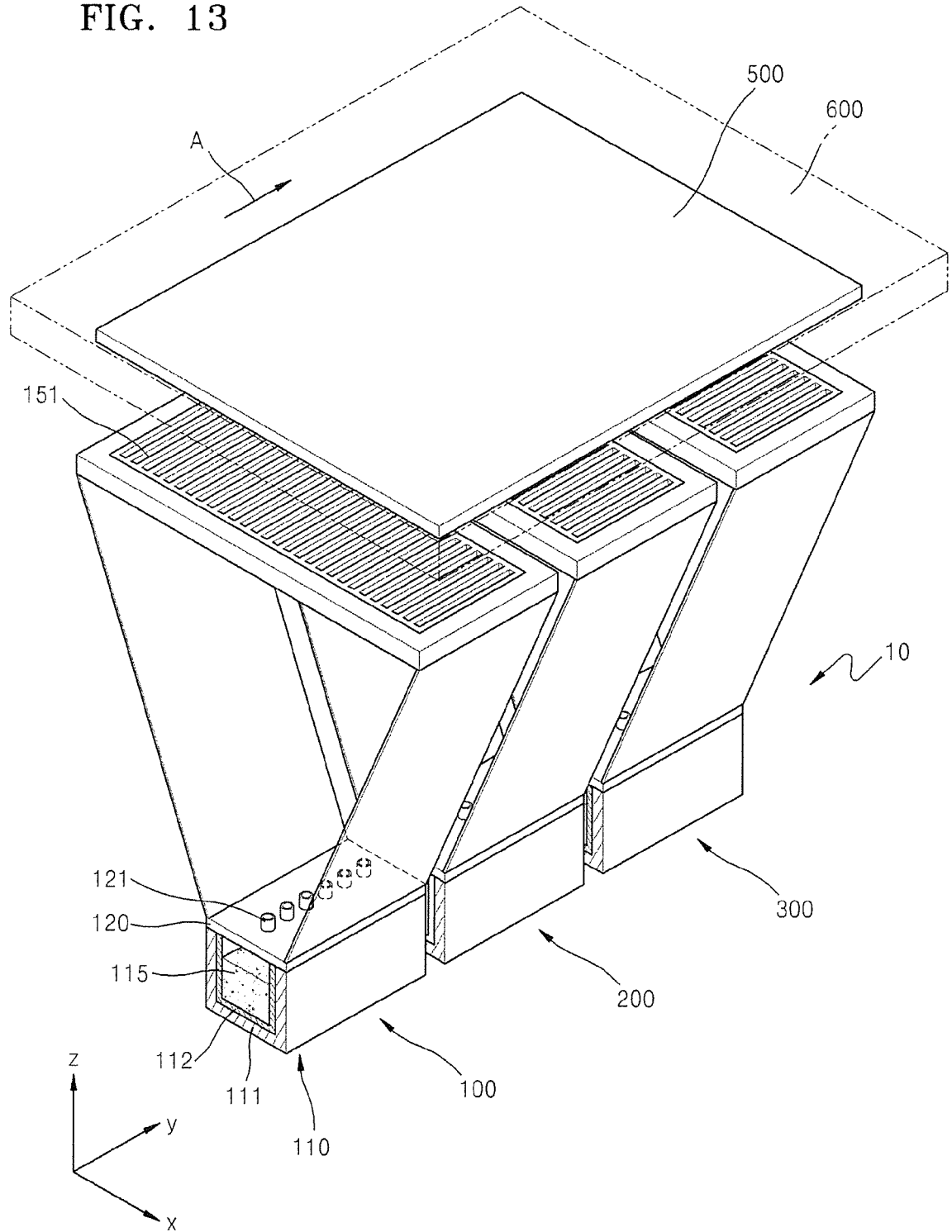
FIG. 13 is a schematic perspective view of a thin film deposition assembly according to another embodiment of the present invention.

FIG. 13 is a schematic perspective view of a thin film deposition assembly 10 according to another embodiment of the present invention.

Referring to FIG. 13, the thin film deposition assembly 10 according to the current embodiment of the present invention includes a first thin film deposition assembly 100, a second thin film deposition assembly 200, and a third thin film deposition assembly 300. Each of the first, second, and third thin film deposition assemblies 100, 200, and 300 has the same structure as the thin film deposition assembly 100 described with reference to FIG. 11, and thus, a detailed description thereof is not provided here.

The deposition sources 110 of the first, second, and third thin film deposition assemblies 100, 200, and 300 may contain different deposition materials, respectively. The first thin film deposition assembly 100 may contain a deposition material for forming a red emission layer, the second thin film deposition assembly 200 may contain a deposition material for forming a green emission layer, and the third thin film deposition assembly 300 may contain a deposition material for forming a blue emission layer.

In other words, in a conventional method of manufacturing an organic light emitting display apparatus, a separate chamber and mask are used to form each color emission layer. However, when the organic layer deposition apparatus according to the current embodiment of the present invention is used, the red emission layer, the green emission layer, and the blue emission layer may be formed at the same time (or currently formed) with a single multi-deposition source. Thus, the time to manufacture the organic light emitting display apparatus is sharply reduced. In addition, the organic light emitting display apparatus may be manufactured with a reduced number of chambers, so that equipment costs are also markedly reduced.

Although not illustrated, a patterning slit sheet of the first thin film deposition assembly 100, a patterning slit sheet of the second thin film deposition assembly 200, and a patterning slit sheet of the third thin film deposition assembly 300 may be arranged to be offset by a constant or identical distance with respect to each other, in order for deposition regions corresponding to the patterning slit sheets to not overlap on the substrate 500. In other words, when the first thin film deposition assembly 100, the second thin film deposition assembly 200, and the third thin film deposition assembly 200 are used to deposit the red emission layer, the green emission layer, and the blue emission layer, respectively, patterning slits 151 of the first thin film deposition assembly 100, patterning slits 251 of the second thin film deposition assembly 200, and patterning slits 351 of the third thin film deposition assembly 300 are arranged to not be aligned or overlapped with respect to each other, in order to form the red emission layer, the green emission layer, and the blue emission layer in different regions of the substrate 500.

In addition, deposition materials for forming the red emission layer, the green emission layer, and the blue emission layer may have different vaporization temperatures. Therefore, the temperatures of deposition sources of the respective first, second, and third thin film deposition assemblies 100, 200, and 300 may be set different from each other.

Although the thin film deposition apparatus according to the current embodiment of the present invention includes three thin film deposition assemblies, the present invention is not limited thereto. In other words, a thin film deposition apparatus according to another embodiment of the present invention may include a plurality of thin film deposition assemblies, each of which contains a different deposition material. For example, a thin film deposition apparatus according to another embodiment of the present invention may include five thin film deposition assemblies respectively containing materials for a red emission layer, a green emission layer, a blue emission layer, an auxiliary layer of the red emission layer, and an auxiliary layer of the green emission layer.

In addition, a plurality of the thin film deposition assemblies each as the previous assemblies illustrated in FIG. 12 may be disposed as shown in FIG. 13.

Figure 14:
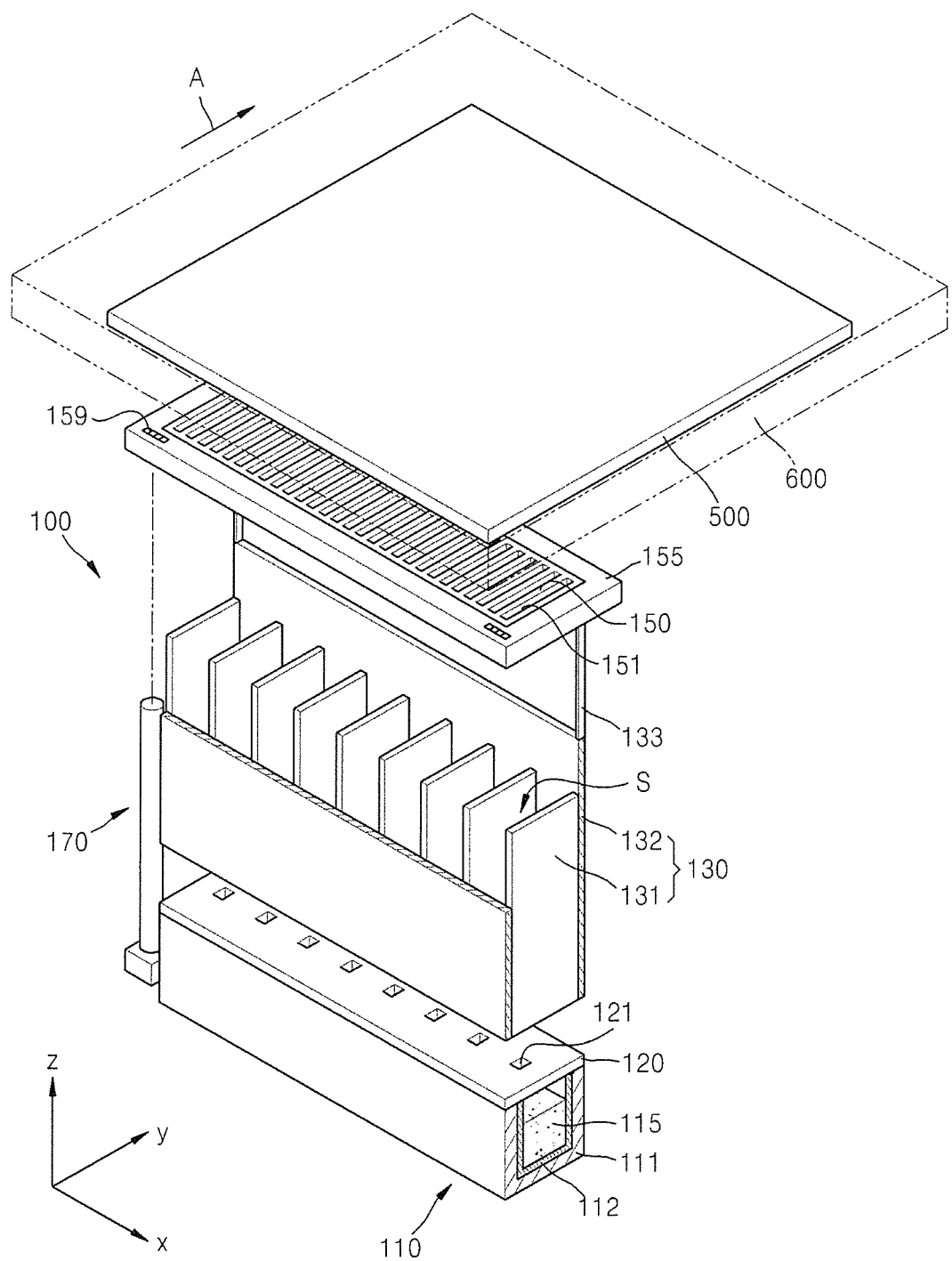
FIG. 14 is a schematic perspective cutaway view of a thin film deposition assembly according to another embodiment of the present invention.

FIG. 14 is a schematic perspective cutaway view of a thin film deposition assembly 100 according to another embodiment of the present invention.

Referring to FIG. 14, the thin film deposition assembly 100 according to the current embodiment of the present invention includes the deposition source 110, the deposition source nozzle unit 120, a barrier plate assembly 130, and the patterning slits 151.

Although a chamber is not illustrated in FIG. 14, for convenience of explanation, all the components of the thin film deposition assembly 100 may be disposed within a chamber that is maintained at an appropriate degree of vacuum. The chamber is maintained at an appropriate vacuum in order to allow a deposition material to move in a substantially straight line through the thin film deposition assembly 100.

In the chamber (e.g., the chamber 731 of FIG. 7), the substrate 500, which is a deposition target, is transferred by the electrostatic chuck 600. The substrate 500 may be a substrate for flat panel displays. A large substrate, such as a mother glass, for manufacturing a plurality of flat panel displays, may also be used as the substrate 500. Other substrates may also be employed.

In the current embodiment, the substrate 500 is moved relative to the thin film deposition assembly 100. For example, the substrate 500 may be moved in a direction of an arrow A, relative to the thin film deposition assembly 100.

Similar to the embodiment described above with reference to FIG. 11, in the thin film deposition assembly 100 according to the current embodiment of the present invention, the patterning slit sheet 150 may be significantly smaller than an FMM used in a conventional deposition method.

The deposition source 110 that contains and heats the deposition material 115 is disposed at an opposite side of the chamber to a side at which the substrate 500 is disposed.

The deposition source 110 includes the crucible 112 that is filled with the deposition material 115, and the cooling block 111 surrounding the crucible 112 correspondingly. The cooling block 111 reduces or prevents radiation of heat from the crucible 112 to the outside, e.g., into the first chamber. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals in the x-axis direction. The deposition material 115 that vaporizes in the deposition source 110 passes through the deposition source nozzles 121 of the deposition source nozzle unit 120 towards the substrate 500, which is a target on which the deposition material 115 is to be deposited.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the x-axis direction. In addition, each of the barrier plates 131 may be arranged parallel to a yz plane in FIG. 14, and may have a rectangular shape. The plurality of barrier plates 131 arranged as described above, partition the space between the deposition source nozzle unit 120 and the patterning slit sheet 150 into a plurality of sub-deposition spaces S. In the thin film deposition assembly 100 according to the current embodiment of the present invention, as illustrated in FIG. 14, a deposition space is divided by the barrier plates 131 into sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at a midpoint between two adjacent barrier plates 131. However, the present invention is not limited to this structure. For example, a plurality of deposition source nozzles 121 may be disposed between two adjacent barrier plates 131. In this case, the deposition source nozzles 121 may also be respectively located at a midpoint between two adjacent barrier plates 131.

As described above, since the barrier plates 131 partition the space between the deposition source nozzle unit 120 and the patterning slit sheet 150 into the sub-deposition spaces S, the deposition material 115 discharged through each of the deposition source nozzles 121 is not mixed with the deposition material 115 discharged through the other deposition source nozzles 121, and passes through the patterning slits 151 so as to be deposited on the substrate 500. In other words, the barrier plates 131 guide the deposition material 115, which is discharged through the deposition source nozzles slits 121, to move straight to not flow in the z-axis direction. Accordingly, a smaller shadow zone can be formed on the substrate 500, and thus, the thin film deposition assembly 100 and the substrate 500 can be separated (or spaced apart) from each other by a set or predetermined distance.

The barrier plate frame 132, which covers sides of the barrier plates 131, maintains the positions of the barrier plates 131, and guides the deposition material 115, which is discharged through the deposition source nozzles 121, not to flow in the y-axis direction.

The deposition source nozzle unit 120 and the barrier plate assembly 130 may be separated from each other by a predetermined distance. This may reduce or prevent the heat radiated from the deposition source unit 110 from being conducted to the barrier plate assembly 130. However, aspects of the present invention are not limited to this. For example, an appropriate heat insulator (not shown) may be further disposed between the deposition source nozzle unit 120 and the barrier plate assembly 130. In this case, the deposition source nozzle unit 120 and the barrier plate assembly 130 may be bound together with the heat insulator therebetween.

In addition, the barrier plate assembly 130 may be detachable from the thin film deposition assembly 100. In the thin film deposition assembly 100 according to the current embodiment of the present invention, the deposition space is enclosed by using the barrier plate assembly 130, so that the deposition material 115 that remains undeposited is mostly deposited within the barrier plate assembly 130. Thus, since the barrier plate assembly 130 is detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the present embodiment, a reuse rate of the deposition material 115 is increased, so that the deposition efficiency is improved, and thus, the manufacturing costs are reduced.

The patterning slit sheet 150 and a frame 155 in which the patterning slit sheet 150 is bound are disposed between the deposition source 110 and the substrate 500. The frame 155 may be formed to have a lattice shape, similar to a window frame. The patterning slit sheet 150 includes a plurality of patterning slits 151 arranged in the x-axis direction. The patterning slits 151 extend in the y-axis direction. The deposition material 115 that has vaporized in the deposition source 110 and passed through the deposition source nozzle 121 passes through the patterning slits 151 towards the substrate 500 that is the deposition target.

The patterning slit sheet 150 may be formed of a metal thin film. The patterning slit sheet 150 is fixed to the frame 155 such that a tensile force is exerted thereon. The patterning slits 151 may be formed by etching the patterning slit sheet 150 to have a stripe pattern.

In the thin film deposition assembly 100 according to the current embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131. The number of patterning slits 151 may be equal to the number of deposition patterns to be formed on the substrate 500.

In addition, the barrier plate assembly 130 and the patterning slit sheet 150 may be disposed separate from each other by a set or predetermined distance. Alternatively, the barrier plate assembly 130 and the patterning slit sheet 150 may be connected by the second connection member 133. The temperature of the barrier plate assembly 130 may increase to 100° C. or higher due to the deposition source 110 that has a high temperature. Thus, in order to prevent the heat of the barrier plate assembly 130 from being conducted to the patterning slit sheet 150, the barrier plate assembly 130 and the patterning slit sheet 150 are separated from each other by a set or predetermined distance.

In order to move the thin film deposition assembly 100 relative to the substrate 500 according to the current embodiment of the present invention, the patterning slit sheet 150 is disposed to be separated from the substrate 500 by a set or predetermined distance. This may be facilitated by installing the barrier plates 131 to reduce the size of the shadow zone formed on the substrate 500.

As, e.g., illustrated in FIG. 13, a plurality of thin film deposition assemblies, each having the same structure as the thin film deposition assembly 100 described above in FIG. 14, may also be successively disposed in the first chamber 731. In this case, the thin film deposition assemblies 100, 200, and 300 may be used to deposit different deposition materials, respectively. For example, the thin film deposition assemblies 100, 200, and 300 may have different patterning slit patterns, so that pixels of different colors, for example, red, green, and blue, may be concurrently or simultaneously defined through a film deposition process.

Figure 15:
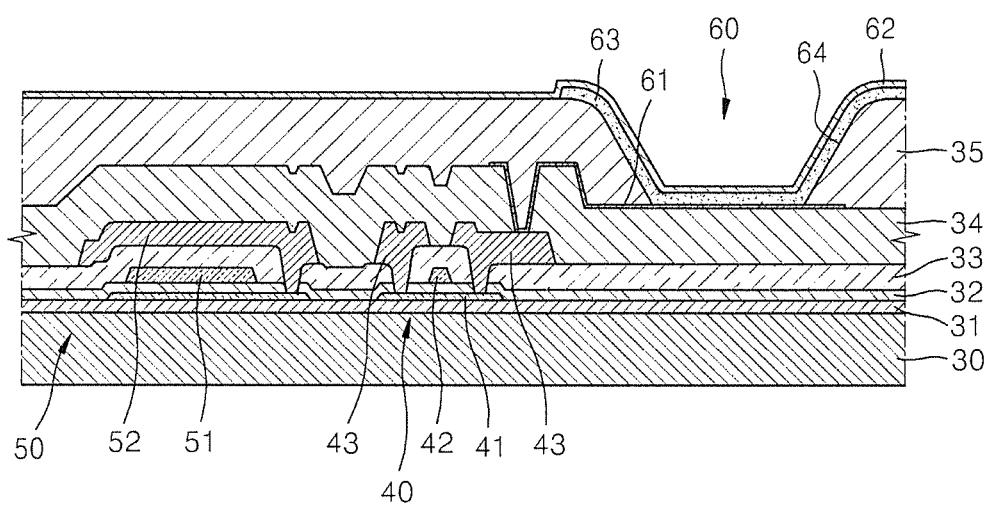
FIG. 15 is a cross-sectional view of an active matrix organic light emitting display apparatus fabricated by using a thin film deposition apparatus, according to an embodiment of the present invention.

FIG. 15 is a cross-sectional view of an active matrix organic light emitting display apparatus fabricated by using a thin film deposition apparatus, according to an embodiment of the present invention.

Referring to FIG. 15, the active matrix organic light emitting display apparatus according to the current embodiment is formed on a substrate 30. The substrate 30 may be formed of a transparent material, for example, glass, plastic, or metal. An insulating layer 31, such as a buffer layer, is formed on an entire surface of the substrate 30.

A thin film transistor (TFT) 40, a capacitor 50, and an organic light emitting diode (OLED) 60 are disposed on the insulating layer 31, as illustrated in FIG. 15. Here, the capacitor includes a first capacitor electrode 51 and a second capacitor electrode 52.

A semiconductor active layer 41 is formed on an upper surface of the insulating layer 31 in a set or predetermined pattern. A gate insulating layer 32 is formed to cover the semiconductor active layer 41. The semiconductor active layer 41 may include a p-type or n-type semiconductor material. In addition, the interlayer insulating layer 33 is formed (patterned) to be between the first capacitor electrode 51 and the second capacitor electrode 52.

A gate electrode 42 of the TFT 40 is formed on an upper surface of the gate insulating layer 32 to correspond to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

Source/drain electrodes 43 are formed on the interlayer insulating layer 33 to contact the semiconductor active layer 41 through a contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays set or predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 on which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one layer selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum ($Alq_3$), and the like. The low-molecular weight organic material may be deposited by vacuum deposition using one of the thin film deposition apparatuses described above with reference to FIGS. 7 through 14.

After the opening 64 is formed in the pixel defining layer 35, the substrate 30 is transferred to the first rack 712, as illustrated in FIG. 7. Target organic materials are loaded into a deposition source unit 110 as illustrated in FIG. 11 through FIG. 14. For example, when a host and a dopant are simultaneously deposited, a host material and a dopant material may be loaded into the different deposition source unit 110 respectively.

After the organic emission layer 63 is formed, the second electrode 62 may be formed by the same deposition method used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of indium tin oxide (ITO), indium zinc oxide (IZO), zinc oxide (ZnO), and/or indium oxide ($In_2O_3$). The reflective electrode may be formed by forming a reflective layer of silver (Ag), magnesium (Mg), aluminum (Al), platinum (Pt), palladium (Pd), gold (Au), nickel (Ni), neodymium (Nd), iridium (Ir), chromium (Cr), or a compound thereof and forming a layer of ITO, IZO, ZnO, and/or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63 and forming an auxiliary electrode layer or a bus electrode line thereon of ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic emission layer 63 and pixel defining layer 35. The second electrode 62 may be formed by using the same deposition method used to form the organic emission layer 63 described above.

A thin film deposition apparatus according to embodiments of the present invention described above, may be applied to form an organic layer or an inorganic layer of an organic TFT, and to form layers from various materials.

According to an electrostatic chuck, a thin film deposition apparatus including the electrostatic chuck, and a method of manufacturing an organic light emitting display apparatus using the thin film deposition apparatus of the present invention, a performance reduction area due to a disconnection process performed when an electrode of the electrostatic chuck is damaged may be reduced or minimized, and thus, increasing the utilization degree of the electrostatic chuck, and the organic light emitting display apparatus may be fabricated efficiently by using the thin film deposition apparatus including the electrostatic chuck.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display apparatus, the method comprising:
    disposing a substrate on an electrostatic chuck which comprises: a first plate; a first common wire disposed on the first plate and electrically connected to a plus (+) terminal of an electric power source; a plurality of first electrode patterns electrically connected to the first common wire between a first end and a second end of the first common wire, separated by a distance from each other, and extending from the first common wire; a second common wire disposed on the first plate and electrically connected to a minus (−) terminal of the electric power source; a plurality of second electrode patterns electrically connected to the second common wire, separated by a distance from each other, and extending from the second common wire; a first additional wire electrically connected to the first common wire at the first end and at the second end; and a second additional wire electrically connected to the second common wire;
    conveying the electrostatic chuck on which the substrate is disposed to pass through a plurality of chambers that are maintained in a vacuum state; and
    forming an organic layer on the substrate by using a thin film deposition assembly disposed in at least one of the chambers, by a movement of the electrostatic chuck or the thin film deposition assembly with respect to the other,
    wherein the thin film deposition assembly comprises a patterning slit sheet smaller than the substrate in a direction parallel to a side of the substrate on which the organic layer is formed.

2. The method of claim 1, wherein two end portions of the first additional wire are respectively connected to two edges of the first common wire.

3. The method of claim 1, wherein two end portions of the second additional wire are respectively connected to two edges of the second common wire.

4. The method of claim 1, wherein the plurality of first electrode patterns and the plurality of second electrode patterns are disposed alternately in parallel with each other.

5. The method of claim 1, wherein the first electrode patterns are perpendicular to the first common wire.

6. The method of claim 1, wherein the electrostatic chuck further comprises:
    a second plate on which a plurality of the first plates are disposed;
    a first connection wire disposed on the second plate to electrically connect the first common wires to each other; and
    a second connection wire disposed on the second plate to electrically connect the second common wires to each other.

* * * * *